(12) United States Patent
Charles et al.

(10) Patent No.: US 11,031,076 B2
(45) Date of Patent: Jun. 8, 2021

(54) MEMORY CIRCUIT CAPABLE OF IMPLEMENTING CALCULATION OPERATIONS

(71) Applicant: Commissariat à l'Énergie Atomique et aux Énergies Alternatives, Paris (FR)

(72) Inventors: Henri-Pierre Charles, Grenoble (FR); Maha Kooli, Grenoble (FR); Jean-Philippe Noel, Eybens (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 16/684,987

(22) Filed: Nov. 15, 2019

(65) Prior Publication Data

US 2020/0160905 A1 May 21, 2020

(30) Foreign Application Priority Data

Nov. 16, 2018 (FR) ...................................... 1871578

(51) Int. Cl.
*G11C 11/419* (2006.01)
*G11C 11/00* (2006.01)
*G11C 11/412* (2006.01)

(52) U.S. Cl.
CPC .......... *G11C 11/419* (2013.01); *G11C 11/005* (2013.01); *G11C 11/412* (2013.01)

(58) Field of Classification Search
CPC ... G11C 11/419; G11C 11/005; G11C 11/412; G11C 11/417; G11C 8/16; G11C 7/1012; G11C 7/1006
See application file for complete search history.

(56) References Cited

U.S. PATENT DOCUMENTS

| | | | |
|---|---|---|---|
| 5,325,500 A | 6/1994 | Bell et al. | |
| 9,432,298 B1* | 8/2016 | Smith | H04L 49/9057 |
| 9,761,300 B1 | 9/2017 | Willcock | |
| 9,898,251 B2 | 2/2018 | Dupont De Dinechin et al. | |
| 2002/0124033 A1 | 9/2002 | Takahashi | |

(Continued)

FOREIGN PATENT DOCUMENTS

EP 3 252 774 A1 12/2017

OTHER PUBLICATIONS

Preliminary Search Report for French Application No. 1871578, dated Sep. 5, 2019.

(Continued)

*Primary Examiner* — Jerome Leboeuf

(74) *Attorney, Agent, or Firm* — Wolf, Greenfield & Sacks, P.C.

(57) ABSTRACT

A memory circuit including: a plurality of elementary storage cells arranged in an array of rows and of columns, the cells of a same column sharing a same read bit line and a same write bit line; an internal control circuit capable of implementing a calculation operation including the simultaneous activation in read mode of at least two rows of the array; and a shuffle circuit including a data input register, a configuration register, and an output port, the shuffle circuit being capable of delivering on its output port the data stored in its input register shuffled according to a shuffle operation defined according to the state of its configuration register.

13 Claims, 10 Drawing Sheets

(56) References Cited

U.S. PATENT DOCUMENTS

| | | | | |
|---|---|---|---|---|
| 2006/0143428 | A1* | 6/2006 | Noda | G06F 7/785 |
| | | | | 712/10 |
| 2009/0141566 | A1* | 6/2009 | Arsovski | G11C 7/1006 |
| | | | | 365/189.15 |
| 2012/0265951 | A1* | 10/2012 | Lin | G11C 16/10 |
| | | | | 711/154 |
| 2013/0262358 | A1* | 10/2013 | Heliot | G06N 3/04 |
| | | | | 706/27 |
| 2016/0189769 | A1 | 6/2016 | Jeloka et al. | |
| 2019/0088307 | A1 | 3/2019 | Burgess et al. | |
| 2020/0005859 | A1* | 1/2020 | Chen | G11C 11/419 |

OTHER PUBLICATIONS

[No Author Listed] Intel® Itanium® Architecture Software Developer's Manual: vol. 3: Intel® Itanium® Instruction Set Reference, Revision 2.3. May 2010:420 pages.

Agarwal et al., An efficient pixel-shuffling based approach to simultaneously perform image compression, encryption and steganography. IJCSMC. May 2013;2(5):376-85.

Akyel et al., DRC 2: Dynamically reconfigurable computing circuit based on memory architecture. 2016 IEEE International Conference on Rebooting Computing (ICRC). Oct. 17, 2016:1-8.

Anderson, Linear pixel shuffling for image processing: an introduction. Journal of Electronic Imaging. Apr. 1993;2(2):147-55.

Beneš, Optimal rearrangeable multistage connecting networks. Bell system technical journal. Jul. 1964;43(4):1641-56.

Beneš, Permutation groups, complexes, and rearrangeable connecting networks. Bell System Technical Journal. Jul. 1964;43(4):1619-40.

Brunie et al. Conception d'une matrice reconfigurable pour coprocesseur fortement couplé. Symposium en Architectures nouvelles de machines. Jan. 2013:1-14.

Charles et al., Smart instruction codes for in-memory computing architectures compatible with standard sram interfaces. Design, Automation and Test in Europe. Mar. 2018:1-7.

Daemen et al., The design of Rijndael: AES—the advanced encryption standard. Springer Science & Business Media. Mar. 9, 2013. 128 pages.

Hilewitz et al., Bit matrix multiplication in commodity processors. IEEE 2008 International Conference on Application-Specific Systems, Architectures and Processors. Jul. 2, 2008:7-12.

Hilewitz, A new basis for shifters in general-purpose processors for existing and advanced bit manipulations. IEEE Transactions on Computers. Aug. 2009;58(8):1035-48.

Kooli et al., Software platform dedicated for in-memory computing circuit evaluation. Proceedings of the 28th International Symposium on Rapid System Prototyping: Shortening the Path from Specification to Prototype. IEEE ACM. Oct. 2017:43-9.

Opferman et al., On a class of rearrangeable switching networks part I: Control algorithm. The Bell System Technical Journal. May 1971;50(5):1579-600.

Wallace, The JPEG still picture compression standard. IEEE Transactions on Consumer Electronics. Feb. 1992;38(1):xviii-xxiv.

FR1871758, Sep. 5, 2019, Preliminary Search Report.

* cited by examiner

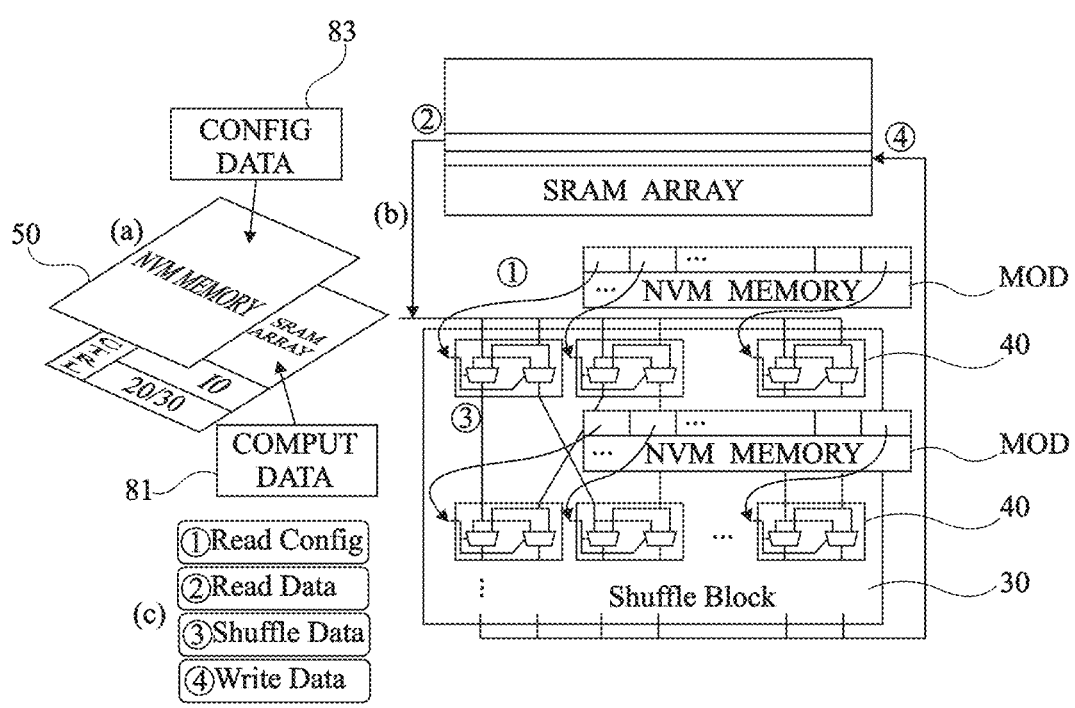
Fig 8bis

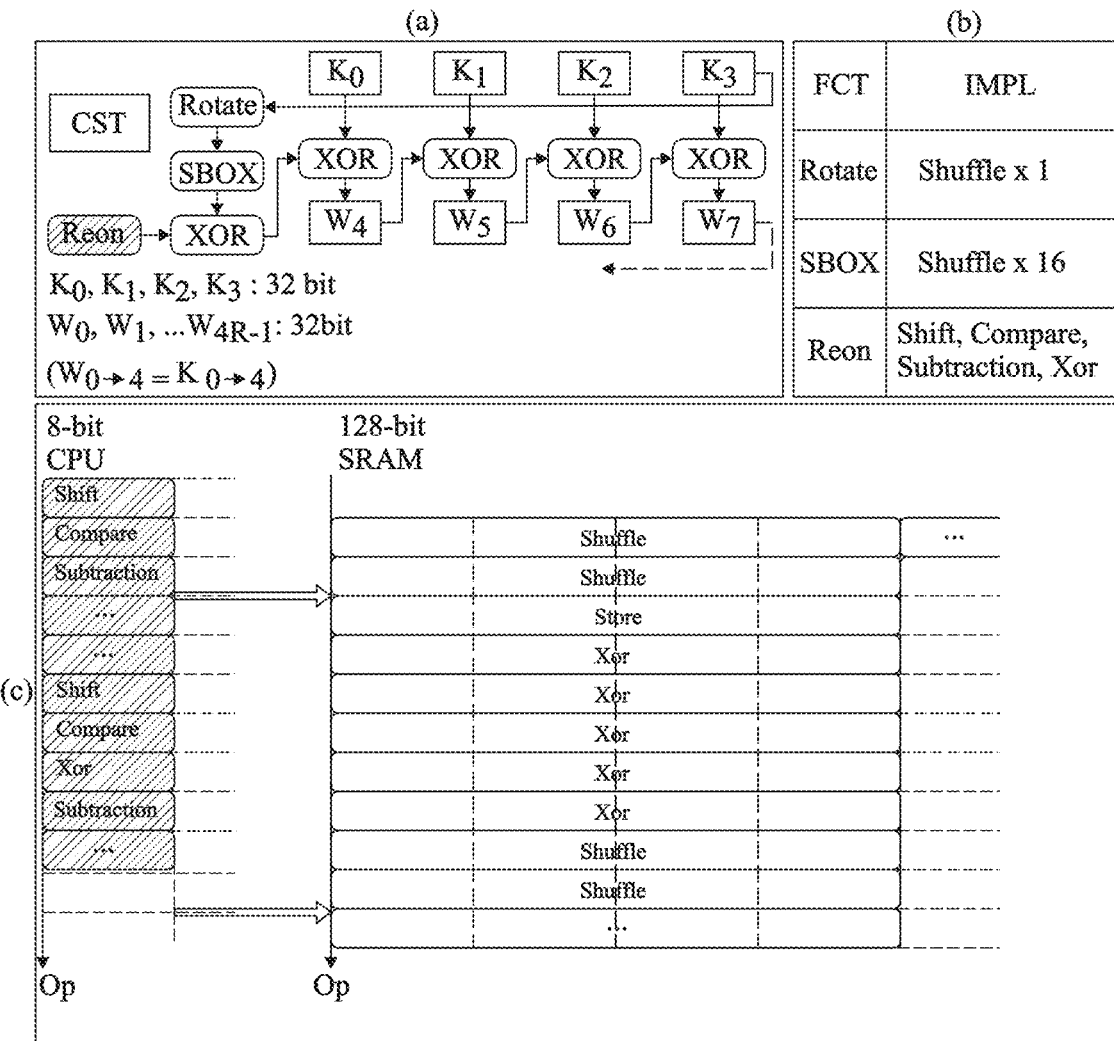
Fig 10 bis

MEMORY CIRCUIT CAPABLE OF IMPLEMENTING CALCULATION OPERATIONS This application claims the priority benefit of French patent application number 18/71578, the content of which is hereby incorporated by reference in its entirety to the maximum extent allowable by law.

TECHNICAL BACKGROUND

The present disclosure relates to the field of memory circuits. It more particularly aims at a memory circuit capable of implementing calculation operations.

PRIOR ART

A memory circuit capable not only of storing data, but also of executing, in situ, during accesses to the memory content, a number of logic and/or arithmetic operations having data stored in the circuit as operands, has already been provided in European patent application EP3252774 (DD16812/B14843), in French patent application No 17/62470 (DD17955/B16064) filed on Dec. 26, 2017, and in French patent application No 17/62468 (DD17885/B16288) filed on Dec. 19, 2017. Such a circuit comprises, as in a conventional memory circuit, a plurality of elementary cells arranged in rows and columns, and a control circuit capable of implementing data read or write operations from or into rows of the array. Unlike a conventional memory circuit where only one row of the array can be selected at a time during a read operation, the control circuit is capable of simultaneously selecting in read mode a plurality of rows of the array to perform an operation having data contained in the selected rows as operands.

It would be desirable to at least partly improve certain aspects of such a memory circuit.

SUMMARY

Thus, an embodiment provides a memory circuit comprising:
a plurality of elementary storage cells arranged in an array of rows and of columns, the cells of a same column sharing a same read bit line and a same write bit line;
an internal control circuit capable of implementing a calculation operation comprising the simultaneous activation in read mode of at least two rows of the array; and
a shuffle circuit including a data input register, a configuration register, and an output port, the shuffle circuit being capable of delivering on its output port the data stored in its input register shuffled according to a shuffle operation defined according to the state of its configuration register,
wherein the shuffle circuit is a configurable routing circuit with a parallel architecture, such that the time of implementation of a shuffle operation is substantially constant whatever the respective contents of the input register and of the configuration register of the shuffle circuit.

According to an embodiment, the control circuit is capable of implementing a shuffle operation comprising a step of reading configuration data stored inside of the memory circuit and of copying the data into the configuration register of the shuffle circuit.

According to an embodiment, the internal control circuit is capable of implementing a shuffle operation comprising:

activating in read mode at least a first row of the array;
copying data read out from the read bit lines of the array into the data input register of the shuffle circuit;
copying data supplied on the output port of the shuffle circuit onto the write bit lines of the array; and
activating in write mode at least one row of the array.

According to an embodiment, the shuffle operation further comprises:
activating in read mode at least a second row of the array; and
copying data read from the read bit lines of the array into the configuration register of the shuffle circuit.

According to an embodiment, the memory circuit further comprises, in addition to the array of elementary storage cells, an additional memory intended to store data of configuration of the shuffle circuit.

According to an embodiment, the shuffle operation further comprises copying the data read from the additional memory into the configuration register of the shuffle circuit.

According to an embodiment, the additional memory is a non-volatile memory.

According to an embodiment, the shuffle circuit comprises a plurality of elementary shuffle cells, each comprising two data inputs e1 and e2, two data outputs s1 and s2, and one configuration input c.

According to an embodiment, the shuffle circuit comprises $(K/2)*(2*\log_2(K)-1)$ elementary shuffle cells arranged in a Benes network, where K is an integer designating the dimension of the input register and of the output port of the shuffle circuit.

According to an embodiment, the shuffle circuit comprises 16 elementary shuffle cells arranged in 5 rows, the rows of rank l=1 to l=3 each comprising 4 elementary cells and the rows of rank l=4 to l=5 each comprising 2 elementary cells, the input register and the output port of the shuffle circuit being of dimension 8, and l being an integer ranging from 1 to 5.

According to an embodiment, the memory circuit further comprises an input-output circuit configurable to couple the read bit lines of the array to the input register of the shuffle circuit and/or to couple the write bit lines of the array to the output port of the shuffle circuit.

According to an embodiment, the memory circuit further comprises a calculation circuit capable of implementing logic or arithmetic operations having data stored in the array of elementary storage cells of the memory circuit as operands.

According to an embodiment, the input-output circuit is further configurable to couple the read bit lines of the array to an input register of the calculation circuit and/or to couple the write bit lines of the array to an output port of the calculation circuit.

The foregoing and other features and advantages will be discussed in detail in the following non-limiting description of specific embodiments in connection with the accompanying drawings.

BRIEF DESCRIPTION OF THE DRAWINGS

FIG. 8*bis* is another illustration of an embodiment of the memory circuit of FIG. 7;

FIG. 10*bis* schematically shows another example of a data processing method capable of being implemented by a memory circuit according to an embodiment.

DESCRIPTION OF THE EMBODIMENTS

Figure 1:
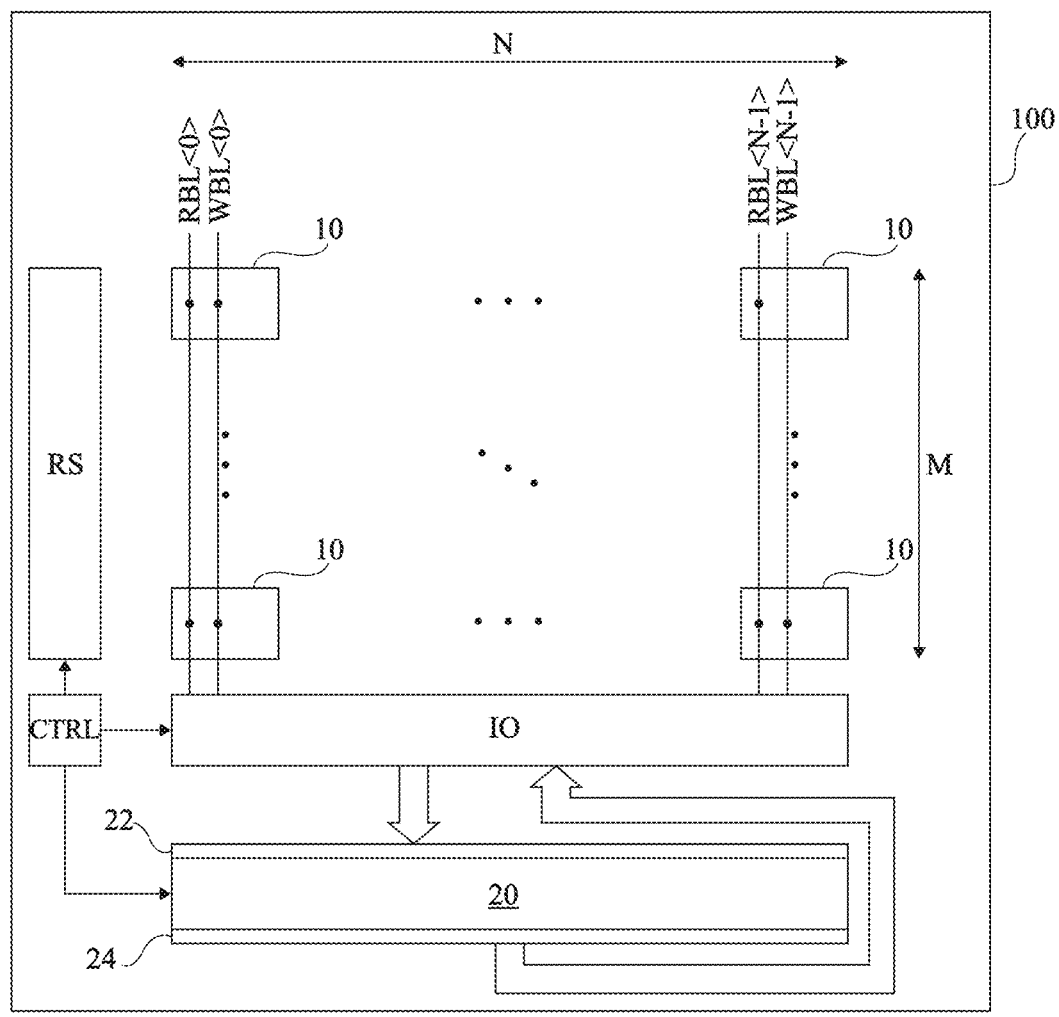
FIG. 1 schematically shows an example of a memory circuit capable of implementing calculation operations.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed. In particular, the complete forming of a memory circuit capable of implementing calculation operations by simultaneous activation in read mode of a plurality of rows of an array of elementary cells has not been detailed, the described embodiments being compatible with known architectures of such circuits, and particularly those described in the above-mentioned patent applications.

Throughout the present disclosure, the term "connected" is used to designate a direct electrical connection between circuit elements with no intermediate elements other than conductors, whereas the term "coupled" is used to designate an electrical connection between circuit elements that may be direct, or may be via one or more other elements.

The terms "about", "approximately", "substantially", and "in the order of" are used herein to designate a tolerance of plus or minus 10%, preferably of plus or minus 5%, of the value in question.

In the following description, references to high- and low-level signals should be interpreted in relative fashion, as corresponding to two different states of the binary signals processed by the described circuits. As an example, the high level of the signals corresponds to potentials in the order of a high power supply potential VDD of the described circuits (for example, equal to VDD plus or minus 0.5 V), and the low level of the signals corresponds to potentials in the order of a low power supply potential GND of the described circuits (for example, equal to GND plus or minus 0.5 V).

FIG. 1 schematically shows an example of a memory circuit 100. All the elements of memory circuit 100 are for example integrated inside and on top of a same integrated circuit chip.

The memory circuit 100 of FIG. 1 comprises a plurality of elementary cells 10 arranged in an array of rows and columns. In the example of FIG. 1, the array comprises M rows and N columns, where M and N are integers greater than or equal to 2.

Each elementary cell 10 is capable of storing a data bit. The elementary cells 10 of a same column of the array are connected to a same data output conductive track or read bit line RBL of the circuit, and to a same data input conductive track or write bit line WBL of the circuit, it being understood that the elementary cells 10 of different columns are connected to different read bit lines RBL and to different write bit lines WBL. In other words, for each column of rank j of the array, where j is an integer in the range from 0 to N−1, memory circuit 100 comprises a read bit lines RBL<j> and a write bit line WBL<j> specific to the column, interconnecting the column cells. The read bit lines RBL<j> and the write bit lines WBL<j> extend in the column direction of the array, that is, vertically in the orientation of FIG. 1. The read bit lines RBL<j> and the write bit lines WBL<j> are connected to a same input-output circuit IO of the memory circuit, for example, arranged at one end of the columns of the array Memory circuit 100 further comprises a row selection circuit RS, for example, arranged at one end of the rows of the array.

Memory circuit 100 further comprises a control circuit CTRL capable of receiving instructions originating from a device external to the memory circuit, and of accordingly controlling the elementary cells 10 of the memory circuit via row selection circuit RS and/or via input-output circuit IO.

In this example, the memory circuit is capable not only of storing data, but also of executing, in situ, during accesses to the memory content, a number of logic and/or arithmetic operations having data stored in the memory circuit as operands. The results of the calculations may be transmitted to circuits external to the memory circuit and/or be written back into the memory circuit without transiting through circuits external to the memory circuit, and particularly over a data bus external to the memory circuit.

In the example of FIG. 1, memory circuit 100 comprises a calculation circuit 20, for example, arranged at one end of the columns of the array, capable of implementing logic or arithmetic operations having data stored in the storage array of the memory circuit as operands. In the shown example, calculation circuit 20 comprises a data input register 22, for example, of dimension N, and a data output port 24, for example of same dimension N. The data input register 22 and the data output port 24 of calculation circuit 20 are coupled to the input-output circuit IO of the memory circuit. To implement a calculation operation by means of circuit 20, control circuit CTRL controls the reading of one or a plurality of operand data from the storage array of the memory circuit and the writing of the operand data, via input-output circuit IO, into the data input register 22 of calculation circuit 20. Control circuit CTRL further controls circuit 20 to implement the desired operation. The result of the operation is delivered on the output port 24 of calculation circuit 20 and may be directly written back into the storage array of the memory circuit via input-output circuit IO, without transiting through circuits external to the memory circuit.

Figure 2:
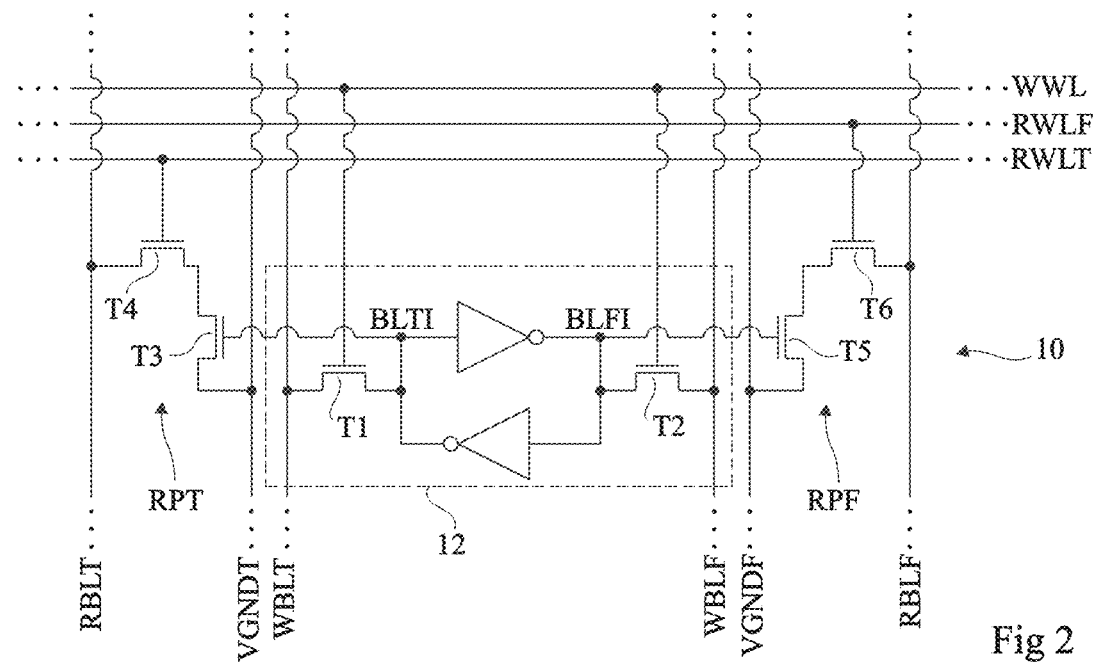
FIG. 2 is a more detailed electric diagram of an example of an elementary storage cell of a memory circuit.

FIG. 2 is a detailed electric diagram of an example of an elementary cell 10 of a memory circuit of the type described in relation with FIG. 1.

Elementary cell 10 of FIG. 2 is a cell comprising ten transistors. It comprises a SRAM storage cell 12 comprising six transistors, and two read ports RPT and RPF comprising two transistors each. Storage cell 12 comprises two inverters (two transistors each) assembled in antiparallel between a first data bit storage node BLTI and a second node BLFI for storing a data bit complementary to the bit stored on node BLTI. Storage cell 12 further comprises a first access transistor T1 connecting, by its conduction nodes, node BLTI to a conductive track WBLT called write bit line, and a second access transistor T2 connecting, by its conduction nodes, node BLFI to a conductive track WBLF called complementary write bit line. The gates of transistors T1 and T2 are coupled to a same conductive write control track WWL. Read port RPT comprises two transistors T3 and T4 series-assembled via their conduction nodes between a conductive track VGNDT of application of a reference potential and a conductive output track RBLT called read bit line. Transistor T3 is located on the side of track VGNDT and has its gate coupled to node BLTI, and transistor T4 is located on the side of track RBLT and has its gate coupled to a conductive read control track RWLT. Read port RPF comprises two transistors T5 and T6 series-assembled via their conduction nodes between a conductive track VGNDF of application of a reference potential and a conductive output track RBLF called complementary read bit line. Transistor T5 is located on the side of track VGNDF and has its gate coupled to node BLFI, and transistor T6 is located on the side of track RBLF and has its gate coupled to a conductive read control track RWLF. In this example, transistors T1, T2, T3, T4, T5, T6 are N-channel MOS transistors.

In a memory circuit of the type described in relation with FIG. 1, the elementary cells of a same row of the circuit are interconnected via their conductive tracks WWL, respectively RWLF, respectively RWLT, and the elementary cells of a same column of the circuit are interconnected via their conductive tracks RBLT, respectively VGNDT, respectively WBLT, respectively WBLF, respectively VGNDF, respectively RBLF. In other words, the cells of a same row share a same conductive track WWL, a same conductive track RWLF, and a same conductive track RWLT, and the cells of a same column share a same conductive track RBLT, a same conductive track VGNDT, a same conductive track WBLT, a same conductive track WBLF, a same conductive track VGNDF, and a same conductive track RBLF. The cells of different rows have different conductive tracks WWL, respectively RWLF, respectively RWLT, and the cells of different columns have different conductive tracks RBLT, respectively VGNDT, respectively WBLT, respectively WBLF, respectively VGNDF, respectively RBLF. As an example, conductive tracks WWL, RWLF, and RWLT are connected to the row selection circuit RS of the memory circuit, and conductive tracks RBLT, VGNDT, WBLT, WBLF, VGNDF, and RBLF are connected to the input-output circuit IO of the memory circuit.

As an example, the read bit line RBLT and the write bit line WBLT of cell 10 of FIG. 2 respectively correspond to a read bit line RBL and to a write bit line WBL of the memory circuit of FIG. 1. For simplification, in the drawings of the memory circuit of the present application (FIGS. 1, 3, and 7), a single read bit line and a single write bit line have been show per elementary cell of the memory circuit. In practice, the described embodiments may be implemented either in memory circuits formed of elementary cells with a single read bit line and a single write bit line, or in memory circuits formed of elementary cells with two complementary read bit lines, for example, of the type described in relation with FIG. 2.

To read from an elementary cell 10 of the type described in relation with FIG. 2 via its read port RPT, the read bit line RBLT of the cell is first precharged to a high level, for example, to power supply voltage VDD of the memory circuit. Conductive track VGNDT is maintained at a low level, for example, at low potential GND used as a reference for power supply voltage VDD of the memory circuit. Transistor T4 of the cell is then turned on by application of a high-level signal to the conductive track RWLT of the cell. After the activation of transistor T4, conductive track RBLT discharges if the potential of node BLTI is at a high level (transistor T3 on) and remains substantially at its precharge level if potential BLTI is at a low level (transistor T3 off). The reading of the potential of track RBLT via the input-output circuit IO of the memory circuit enables to determine the value of the data bit stored in the elementary cell. The cell may further be read from substantially in the same way via its read port RPF.

To implement calculation operations, in a memory circuit formed of elementary cells 10 of the type described in relation with FIG. 2, the control circuit CTLR of the memory module is capable of simultaneously activating in read mode (via row selection circuit RS) two, or a number greater than two, of elementary cells of a same column of the module, via the access ports RPT and/or via the access ports RPF of these cells.

As an illustration, it is considered that two elementary cells 10 of a same column are simultaneously activated in read mode via their ports RPT and RPF. To achieve this, after having precharged to a high level the read bit lines RBLT and RBLF of the column and set to a low level the reference conductive tracks VGNDT and VGNDF of the column, the selection transistors T4 and T6 of the two selected cells are simultaneously turned on, via the control conductive tracks RWLT and RWLF of the corresponding rows. The binary values stored on nodes BLTI of the two considered cells are respectively called A and B. Complementary binary values NA and NB are then stored on the respective nodes BLFI of the two cells. The conductive output track RBLT of the column remains at its high precharge level only if the two values A and B are at a low level. Thus, the level read from output track RBLT of the column at the end of the read operation corresponds to result NA.NB of a logic NOR calculation operation between the two selected memory cells. Further, the conductive output track RBLF of the column remains at its high precharge level only if the two values A and B are at a high level. Thus, the level read from output track RBLF of the column at the end of the read operation corresponds to result A.B of a logic AND calculation operation between the two selected memory cells.

By simultaneously activating in read mode a number greater than two of cells of a same column, the above-mentioned calculations operations may be implemented with a number of operands greater than 2. Further, by simultaneously activating in read mode a plurality of memory circuit columns, the calculation operations may be implemented on words comprising a plurality of bits.

Thus, basic calculation operations may be directly implemented in the memory, without needing to have the data transit through an arithmetic and logic unit external to the circuit To enable to write back the result of a calculation operation without having the calculated data transit through circuits external to the memory circuit, and particularly over a data bus external to the memory circuit, the input-output circuit IO of the memory circuit may comprise an internal redirection circuit (not detailed) enabling to couple the read bit line(s) of each column of the memory circuit to a data input node of the column and/or of another column of the array, for example, to the conductive track WBLT and/or to the conductive track WBLF of the column or of another column of the array in an architecture of the type described in relation with FIG. 2.

To implement more calculation operations, for example, arithmetical operations, the operand data may be transmitted to calculation circuit 20. For this purpose, the internal redirection of input-output circuit IO may be configured to couple the read bit lines of the memory circuit to input nodes of the data input register 22 of calculation circuit 20. Once the operation has been performed, the internal redirection circuit of input-output circuit IO may be configured to couple the write bit lines of the memory circuit to output nodes of the data output port 24 of calculation circuit 20 to enable to write back the result of the calculation operation without having the calculated data transit through circuits external to the memory circuit, and particularly over a data bus external to the memory circuit.

Figure 3:
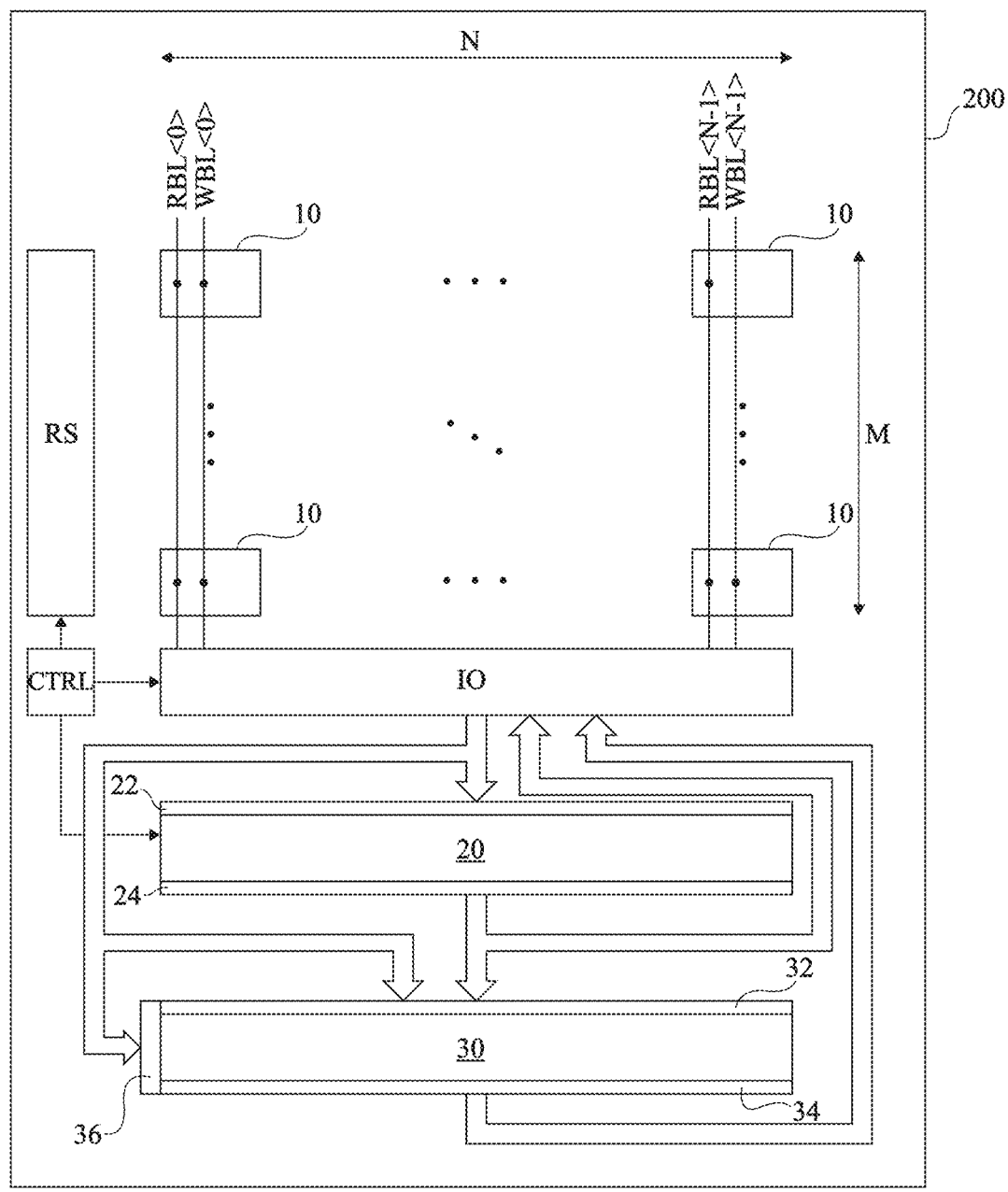
FIG. 3 schematically shows an example of a memory circuit according to an embodiment.

FIG. 3 schematically shows an example of a memory circuit 200 according to an embodiment. As in the example of FIG. 1, all the elements of memory circuit 200 may be integrated inside and on top of a same semiconductor chip.

The memory circuit 200 of FIG. 3 comprises the same elements as the memory circuit 100 of FIG. 1, arranged substantially in the same way.

Memory circuit 200 further comprises a shuffle circuit 30. Shuffle circuit 30 comprises a data input register 32 of dimension K, that is, capable of simultaneously receiving (in parallel) and of storing K data bits, and a data output port 34 of same dimension K, that is, capable of simultaneously delivering (in parallel) K data bits. As an example, dimension K of shuffle circuit 30 is equal to number N of columns of the storage cell array of the memory circuit. Shuffle circuit 30 further comprises a configuration register 36. The shuffle circuit is capable of delivering on its output port the K bits stored in its data input register, shuffled according to a shuffle operation defined according to the state of its configuration register 36.

A shuffle operation here means that the K input bits of circuit 30 are copied at the output of circuit 30, but in a different order. The total number of possible shuffle operations for a K-bit input vector is equal to K! (K factorial), that is $K*(K-1)*(K-2)* \ldots *2*1$. Shuffle circuit 30 is for example configurable, via its configuration register 36, to implement any of the K! possible shuffle operations.

Data input register 32, the data output port 34 and the configuration register 36 of shuffle circuit 30 are coupled to the input-output circuit IO of the memory circuit. To implement a shuffle operation by means of circuit 30, control circuit CTRL orders the reading of input data from the storage array of the memory circuit, the writing of the data, via input-output circuit IO, into the data input register 32 of shuffle circuit 30, the reading of configuration data from the storage array of the memory circuit, and the writing of the data, via input-output circuit IO, into the configuration register 36 of shuffle circuit 30. For this purpose, the internal redirection circuit of input-output circuit IO may be configured to couple the read bit lines of the memory circuit to input nodes of the data input register 32 of shuffle circuit 30 and/or to input nodes of the configuration register 36 of shuffle circuit 30. The result of the shuffle operation is delivered to the output port 34 of shuffle circuit 30, and may be directly written back into the storage array of the memory circuit via input-output circuit IO, without transiting through circuits external to the memory circuit. For this purpose, the internal redirection circuit of input-output circuit IO may be configured to couple the write bit lines of the memory circuit to output nodes of the data output port 34 of shuffle circuit 30. The duration of the actual shuffle operation is a constant or substantially constant duration (where the propagation delays may of course slightly vary according to the power, voltage, and/or temperature conditions and, by a lesser extent, according to the respective contents of the registers according to the routing circuit architecture). This duration is for example smaller than or equal to a cycle of a clock rating the logic or arithmetic operations performed in the memory circuit. For this purpose, shuffle circuit 30 is a circuit with a parallel architecture, of configurable routing circuit type. This enables to considerably ease the compilation of a program intended to be executed on an integrated circuit comprising at least one processor and one so-called intelligent memory circuit, of the type described in relation with FIG. 3. Indeed, to perform an operation of shuffling of a word of dimension K, only one piece of shuffle configuration data is to be stored.

Figure 4:
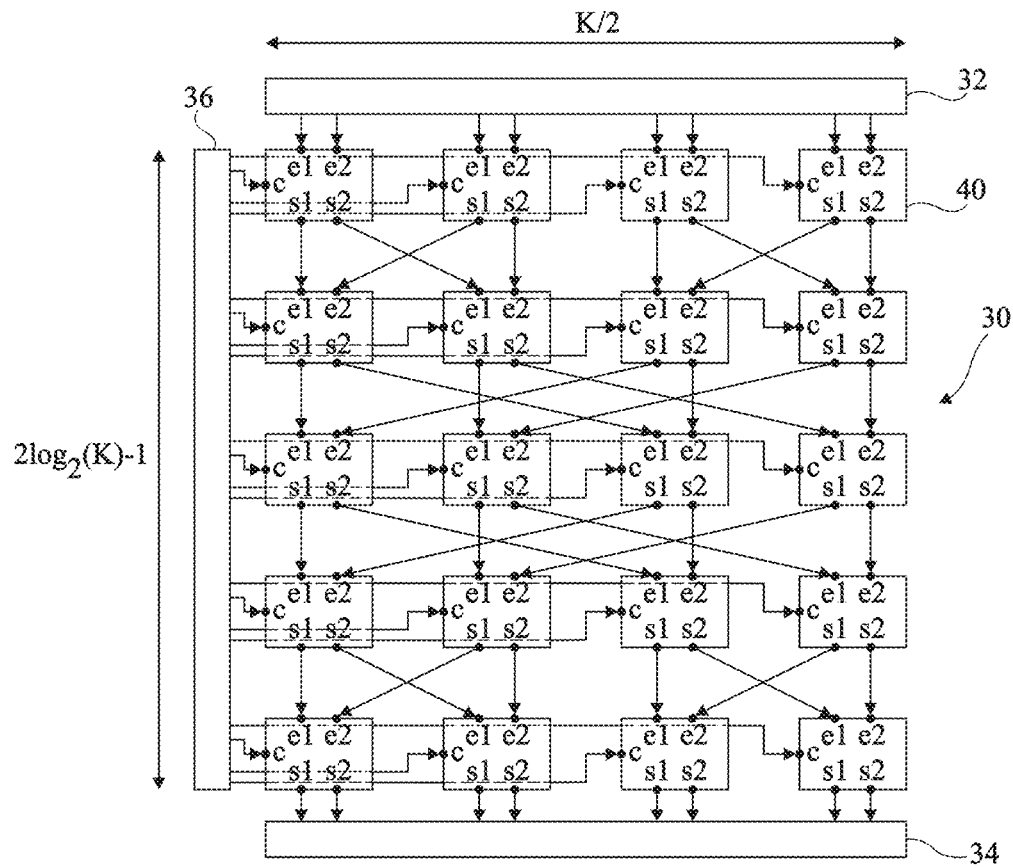
FIG. 4 shows in further detail an embodiment of a shuffle circuit of the memory circuit of FIG. 3.

FIG. 4 shows in further detail an embodiment of the shuffle circuit 30 of the memory circuit of FIG. 3. In this example, a shuffle circuit of dimension K=8, that is, where input and output registers 32 and 34 each have a dimension K=8, is considered as an illustration. It will be within the abilities of those skilled in the art to generalize this example to the forming of a shuffle circuit of any dimension K, where $K=2^{H-1}$ (two raised to power H) and H is a positive integer. It should be noted that in the case where dimension D of the memory data is not a power of two, K may be selected to be greater than D, for example, equal to the first power of two greater than D ($K=2^H$ with H such that $2^{H-1}<D<K=2^H$), and the data of the memory may be completed by 0s to obtain input words of dimension K.

In the example of FIG. 4, the shuffle circuit is formed by means of a Benes network formed of $(K/2)*(2*\log_2(K)-1)$ elementary shuffle cells 40. In the example of FIG. 4, the elementary shuffle cells 40 are arranged in an array of $2*\log_2(K)-1$ rows and K/2 columns.

Each elementary shuffle cell 40 comprises two input nodes e1 and e2, two output nodes s1 and s2, and one configuration node c. Each elementary cell 40 is capable of copying on its output nodes s1 and s2 the signals respectively applied to its input nodes e2 and e1, according to the state of the signal applied to its configuration node c.

The K input nodes e1, e2 of the cells 40 of the row of rank 1=1,1 being an integer ranging from 1 to $2*\log_2(K)-1$, are coupled, preferably connected, respectively to the K storage nodes of the data input register 32 of the shuffle circuit. The K output nodes s1, s2 of the cells 40 of the row of rank $1=2*\log_2(K)-1$ are coupled, preferably connected, respectively to the K output nodes of the output port 34 of the shuffle circuit. In this example, configuration register 36 comprises $(K/2)*(2*\log_2(K)-1)$ storage nodes respectively coupled to the configuration nodes c of the $(K/2)*(2*\log_2(K)-1)$ cells 40 of the shuffle circuit.

In each row of rank 1=1 to $1=\log_2(K)-1$, the cells of the row are distributed in groups of $n=2^l$ neighboring cells having their output nodes s1, s2 coupled to the input nodes e1, e2 of the cells of the next row (the row of rank 1+1) according to a cross coupling defined as follows:

each of the n/2 first cells of the group has its output node
s1 coupled, preferably connected, to the node e1 of the cell of same position in row 1+1;

each of the n/2 last cells of the group has its output node
s2 coupled, preferably connected, to the node e2 of the cell of same position in row 1+1;

each of the n/2 first cells of the group has its output node
s2 coupled, preferably connected, to the node e1 of the cell of position $m+2^{l-1}$ in row 1+1 (m being an integer ranging from 1 to K/2 designating the position of the considered cell in the row of rank l); and each of the n/2 last cells of the group has its output node s1 coupled, preferably connected, to the node e2 of the cell of position $m-2^{l-1}$ in row l+1.

The array is symmetrical with respect to the central row of rank $l=\log_2(K)$, that is, in each row of rank $l=\log_2(K)$ to $l=2*\log_2(K)-2$, the cells of the row are distributed in groups of $n=2^{(2*\log_2(K)-l-1)}$ neighboring cells having their output nodes s1, s2 coupled to the input nodes e1, e2 of the cells of the next rank (row (l+1)) according to a cross coupling defined as follows:

each of the n/2 first cells of the group has its output node s1 coupled, preferably connected, to the node e1 of the cell of same position in row l+1;

each of the n/2 last cells of the group has its output node s2 coupled, preferably connected, to the node e2 of the cell of same position in row l+1;

each of the n/2 first cells of the group has its output node s2 coupled, preferably connected, to the node e1 of the cell of position $m+2^{(2*\log_2(K)-2-1)}$ in row l+1; and each of the n/2 last cells of the group has its output node s1 coupled, preferably connected, to the node e2 of the cell of position $m-2^{(2*\log_2(K)-2-1)}$ in row l+1.

Figure 5:
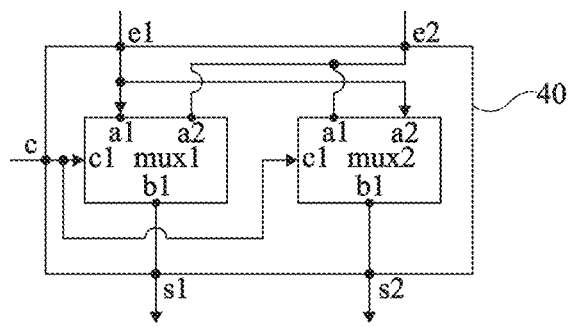
FIG. 5 shows an embodiment of an elementary shuffle cell of the shuffle circuit of FIG. 4.

FIG. 5 shows an example of an elementary shuffle cell 40 of the shuffle circuit of FIG. 4.

The cell 40 of FIG. 5 comprises two multiplexers mux1 and mux2, for example identical, with two inputs and one output. Each of multiplexers mux1 and mux2 comprises two input nodes a1 and a2, an output node b1, and a configuration node c1, and is capable of delivering on its output node b1 one or the other of the signals applied to its input nodes a1 and a2, according to the state of the signal applied to its configuration node c1.

The input node e1 of cell 40 is connected to the input node a1 of multiplexer mux1 and to the input node a2 of multiplexer mux2. The input node e2 of cell 40 is connected to the input node a2 of multiplexer mux1 and to the input node a1 of multiplexer mux2. The configuration node c of cell 40 is connected to the configuration nodes c1 of multiplexers mux1 and mux2.

According to the state of the signal applied to its configuration node c, cell 40 delivers on its node s1 the signal applied to its node e1 and delivers on its node s2 the signal applied to its node e2, or delivers on its node s1 the signal applied to its node e2 and delivers on its node s2 the signal applied to its node e1.

Figure 6:
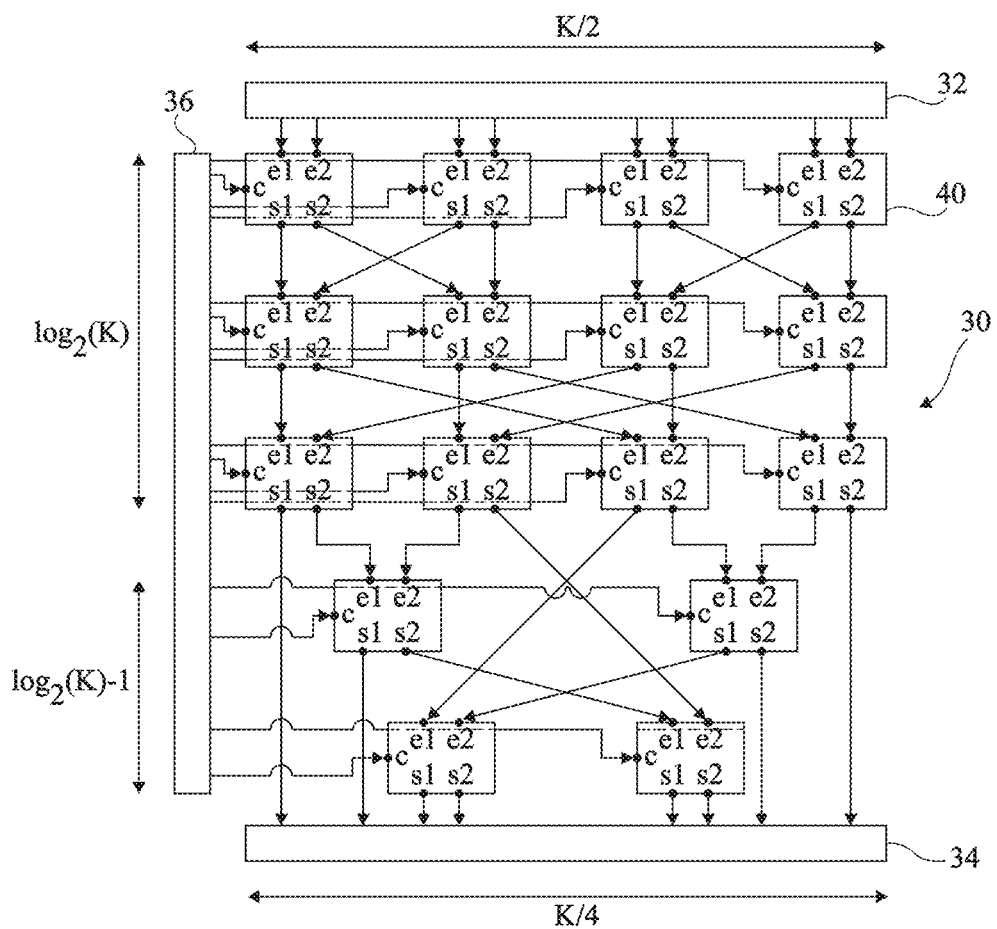
FIG. 6 shows another embodiment of a shuffle circuit of the memory circuit of FIG. 3.

FIG. 6 shows another embodiment of the shuffle circuit 30 of the memory circuit of FIG. 3. As in the example of FIG. 4, a shuffle circuit of dimension K=8, that is, where input register 32 and output register 34 each have a dimension K=8, is here considered as an illustration.

In the example of FIG. 6, the shuffle circuit is formed of an array of 16 elementary shuffle cells 40, for example, identical or similar to those of the shuffle circuit of FIG. 4. In the example of FIG. 6, the elementary shuffle cells 40 are arranged in 5 rows, the rows of rank l=1 to l=3 each comprising 4 elementary cells 40, and the rows of rank l=4 to l=5 each comprising 2 elementary cells 40.

The K input nodes e1, e2 of the cells 40 of the row of rank l=1 are coupled, preferably connected, respectively to the K storage node of the data input register 32 of the shuffle circuit. In this example, configuration register 36 comprises 16 storage nodes respectively coupled to the configuration nodes c of the 16 cells 40 of the shuffle circuit.

As in the example of FIG. 4, in each row of rank l=1 to l=2, the cells of the row are distributed in groups of $n=2^l$ neighboring cells having their output nodes s1, s2 coupled to the input nodes e1, e2 of the cells of the next row (the row of rank l+1) according to a cross coupling defined as follows:

each of the n/2 first cells of the group has its output node s1 coupled, preferably connected, to the node e1 of the cell of same position in row l+1;

each of the n/2 last cells of the group has its output node s2 coupled, preferably connected, to the node e2 of the cell of same position in row l+1;

each of the n/2 first cells of the group has its output node s2 coupled, preferably connected, to the node e1 of the cell of position $m+2^{l-1}$ in row l+1; and each of the n/2 last cells of the group has its output node s1 coupled, preferably connected, to the node e2 of the cell of position $m-2^{l-1}$ in row l+1.

Conversely to the example of FIG. 4, the array of FIG. 6 is not symmetrical with respect to the central row of rank $l=\log_2(K)=3$. In the example of FIG. 6, the first cell in the row of rank l=4 has its node e1 coupled, preferably connected, to the node s2 of the first cell of the row of rank l=3, and its node e2 coupled, preferably connected, to the node s1 of the second cell of the row of rank l=3. The second cell of the row of rank l=4 has its node e1 coupled, preferably connected, to the node s2 of the third cell of the row of rank l=3, and its node e2 coupled, preferably connected, to the node s1 of the fourth cell of the row of rank l=3. The first cell of the row of rank l=5 has its node e1 coupled, preferably connected, to the node s1 of the third cell of the row of rank l=3, and its node e2 coupled, preferably connected, to the node s1 of the second cell of the row of rank l=4. The second cell of the row of rank l=5 has its node e1 coupled, preferably connected, to the node s2 of the first cell of the row of rank l=4, and its node e2 coupled, preferably connected, to the node s2 of the second cell of the row of rank l=3. The 8 output nodes of the output port 34 of the shuffle circuit are coupled, preferably connected, respectively to the node s1 of the first cell of the row of rank l=3, to the node s1 of the first cell of the row of rank l=4, to the node s1 of the first cell of the row of rank l=5, to the node s2 of the first cell of the row of rank l=5, to the node s1 of the second cell of the row of rank l=5, to the node s2 of the second cell of the row of rank l=5, to the node s2 of the second cell of the row of rank l=4, and to the node s2 of the fourth cell of the row of rank l=3.

An advantage of the shuffle circuit of FIG. 6 is that it comprises a number of elementary shuffle cells 40 smaller than that of FIG. 4. This enables to decrease the bulk and the electric power consumption of the circuit, while enabling to implement all the K! possible shuffle operations for an input vector of dimension K. Further, this enables to decrease the dimension of the configuration register 36 of the shuffle circuit.

More generally, other arrangements of shuffle circuits may be provided, using a number of elementary cells capable of ranging from $\log_2(K!+1)$ to $(K/2)*(2*\log_2(K)-1)$.

Figure 7:
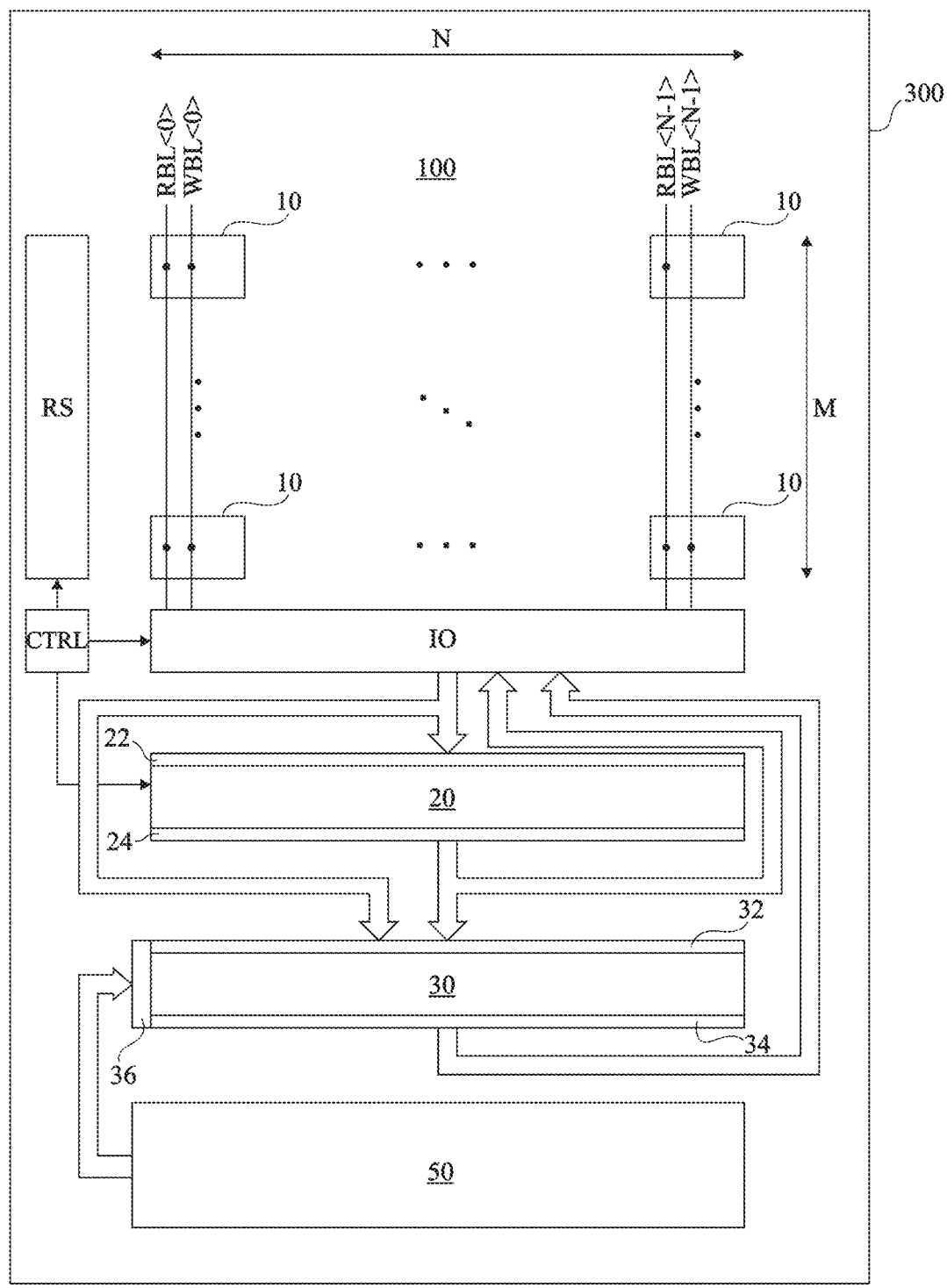
FIG. 7 schematically shows another embodiment of a memory circuit according to an embodiment.

FIG. 7 schematically shows another example of a memory circuit 300 according to an embodiment. As in the example of FIG. 3, all the elements of memory circuit 300 may be integrated inside and on top of a same semiconductor chip.

The memory circuit 300 of FIG. 7 differs from the memory circuit 200 of FIG. 3 mainly in that it comprises, in addition to the main memory formed by the array of storage cells 10, an additional memory 50, for example, a non-volatile memory, intended to store the data of configuration of shuffle circuit 30. Thus, in the example of FIG. 7, the configuration register 36 of shuffle circuit 30, instead of being coupled to the input-output circuit IO of the main memory as in the example of FIG. 3, is coupled to an output port (not detailed in FIG. 7) of additional memory 50.

In the example of FIG. 7, to implement a shuffle operation by means of circuit 30, control circuit CTRL controls the reading of input data from the main memory, the writing of the data, via input-output circuit IO of the main memory, into the data input register 32 of shuffle circuit 30, the reading of configuration data from additional memory 50, and the writing of the data into the configuration register 36 of shuffle circuit 30. The result of the shuffle operation is delivered to output port 34 of shuffle circuit 30, and may be directly written back into the main memory via the input-output circuit IO of the main memory, without transiting through circuits external to the memory circuit.

Figure 8:
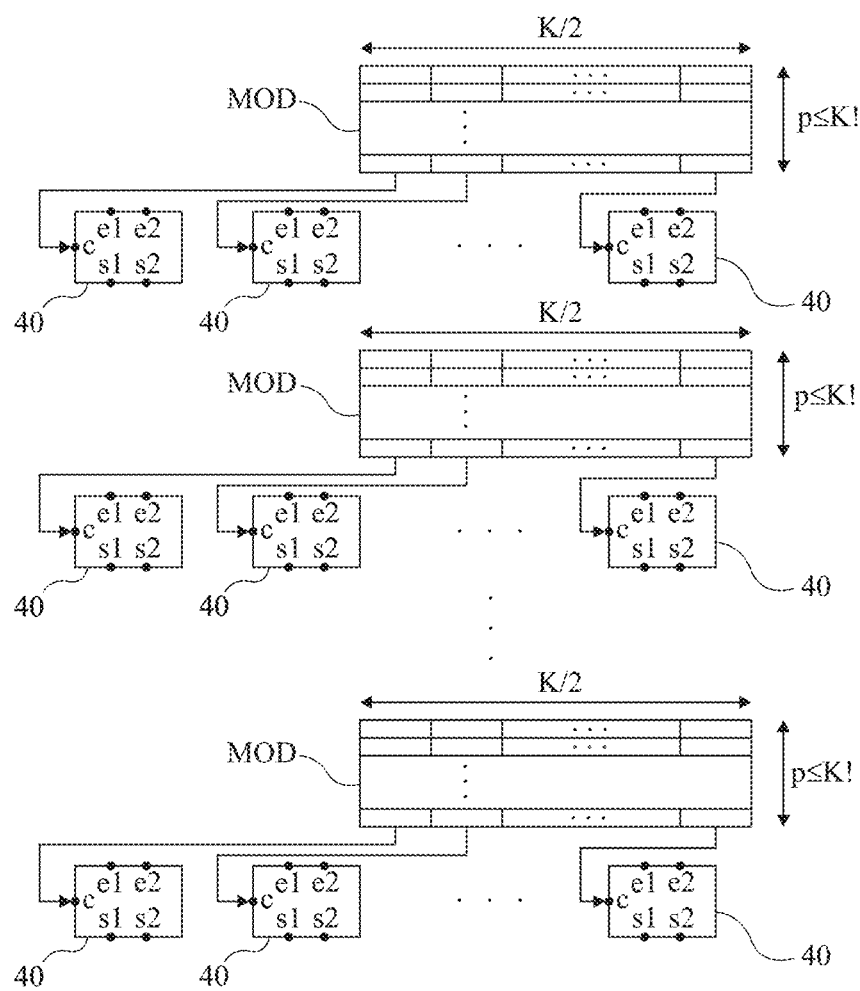
FIG. 8 shows in further detail an embodiment of the memory circuit of FIG. 7.

FIG. 8 illustrates in further detail an embodiment of additional memory 50 in the memory circuit of FIG. 7. In this example, the case where shuffle circuit 30 is a circuit of the type described in relation with FIG. 4 is considered. Additional memory 50 is divided into $2*\log_2(K)-1$ modules MOD of p rows and K/2 columns each, p being an integer smaller than or equal to K! corresponding to the number of stored shuffle operations. Each of the $2*\log_2(K)-1$ modules MOD of p rows by K/2 columns may comprise an output port of dimension K/2, that is, capable of simultaneously delivering, on K/2 distinct output nodes, the K/2 bits of a row of the module. Each of the $2*\log_2(K)-1$ modules MOD of p rows and K/2 columns has its K/2 output nodes respectively coupled to the K/2 configuration nodes c of the elementary shuffle cells 40 of one of the $2*\log_2(K)-1$ rows of K/2 cells 40 of the shuffle network, it being understood that the configuration nodes c of the cells 40 of different rows of the shuffle nodes are respectively coupled to output nodes of different modules MOD of additional memory 50.

In each module MOD of additional memory 50, each of the p rows of the memory module stores a configuration of the corresponding row of shuffle circuit 30, corresponding to one of the K! possible configurations of shuffle circuit 30. A row selection circuit (not detailed in FIG. 8), for example, common to the $2*\log_2(K)-1$ modules MOD of additional memory 50, may be provided to select the desired configuration of shuffle circuit 30.

As compared with the memory circuit of FIG. 1, an advantage of the embodiments described in relation with FIGS. 3 to 8bis is that they enable to place shuffle operations directly in the memory circuit, without needing to have the data to be shuffled transit through external circuits and particularly over data buses external to the memory circuit. Many data processing methods implementing shuffle operations may thus be totally or partly implemented by such a memory circuit, for example, data encryption methods, image processing methods, artificial neural network inference algorithms, etc.

Additional memory 50 is for example a non-volatile memory, for example, a resistive memory, for example, of RRAM or ReRAM type, formed above a semiconductor substrate, for example, made of silicon, having the main memory and the calculation circuit 20 and the shuffle circuit 30 (Shuffle Block) of the memory circuit formed inside and on top of it. This provides a significant density gain since the storage of the shuffle circuit configuration data then causes no increase in the total surface area of the memory circuit.

FIG. 8bis schematically illustrates an example of a memory circuit of the type described in relation with FIG. 7, where additional memory 50 is integrated above a semiconductor substrate, for example, made of silicon, having the main memory and the calculation and shuffle circuits 20 and 30 of the memory circuit formed inside and on top of it. In this example, the additional memory 50 is divided into a plurality of modules MOD such as described in relation with FIG. 8.

As illustrated in view (a) of FIG. 8bis, a first plane comprises the main memory (SRAM ARRAY), comprising cells 10 (not shown in FIG. 8bis), as well as its peripheral circuits, particularly comprising input/output circuit IO, calculation and shuffle circuits 20, 30, and control circuit CTRL. The main memory stores the calculation data 81 (COMPUT DATA). As second plane superposed to the first plane comprises additional memory 50 (NVM MEMORY), which stores the configuration data 83 (CONFIG DATA) of shuffle circuit 30, as well as possibly other data, thus extending the storage capacity of the system. This further eases the connection of the additional memory to the elementary cells 40 of shuffle circuit 30, particularly in the case of a configuration of the type described in relation with FIG. 8, as illustrated by view (b) of FIG. 8bis. In such a configuration, the transmission of the configuration data to the shuffle circuit is easier and faster than when the configuration data are stored in the main memory. In particular, the operation of reading out the configuration words stored in additional memory 50 may be synchronized with or simultaneous to the operation of reading out the data to be shuffled stored in the main memory. To achieve this, a plurality of solutions can be envisaged. For example, the operation of reading out from additional memory 50 may be accelerated by using two elementary storage cells to store a data bit, without using a read amplifier. As a variation, the clock frequency of the main memory (which performs logic and arithmetic operations) may easily be lowered to correspond to the read frequency of additional memory 50. In another variation, the operations of reading from additional memory 50 may be anticipated, the read values being then stored in registers.

As illustrated in view (c) of FIG. 8bis, a shuffle operation may be carried out in three basic steps:

a step 1 (Read Config) of reading configuration data from additional memory 50, and of configuring shuffle circuit 30 by means of these data;

a step 2 (Read Data) of reading input data of the shuffle circuit from the main memory;

a step 3 (Shuffle Data) of shuffling the input bits through the shuffle circuit; and a step 4 (Write Data) of writing back the shuffled data into the main memory.

As an example, a memory circuit of the type described in relation with FIGS. 3 to 8bis may be used to implement a data cipher method of AES ("Advanced Encryption Standard") type. Indeed, the AES standard comprises at least two data shuffle steps, capable of being implemented by such a memory circuit.

More particularly, the AES standard comprises a step called SubBytes, during which input data, in the form of a vector of a plurality of words of 8 bits each (or bytes), is submitted to a series of a plurality of successive shuffles, selected from a set of a plurality of series of shuffle operations, called Sbox. The different configurations of shuffle circuit 30, corresponding to the different series of shuffle operations or Sbox, may be stored in the memory circuit, in the main memory in the example of FIG. 3 or in the additional memory in the example of FIG. 7.

Figure 9:
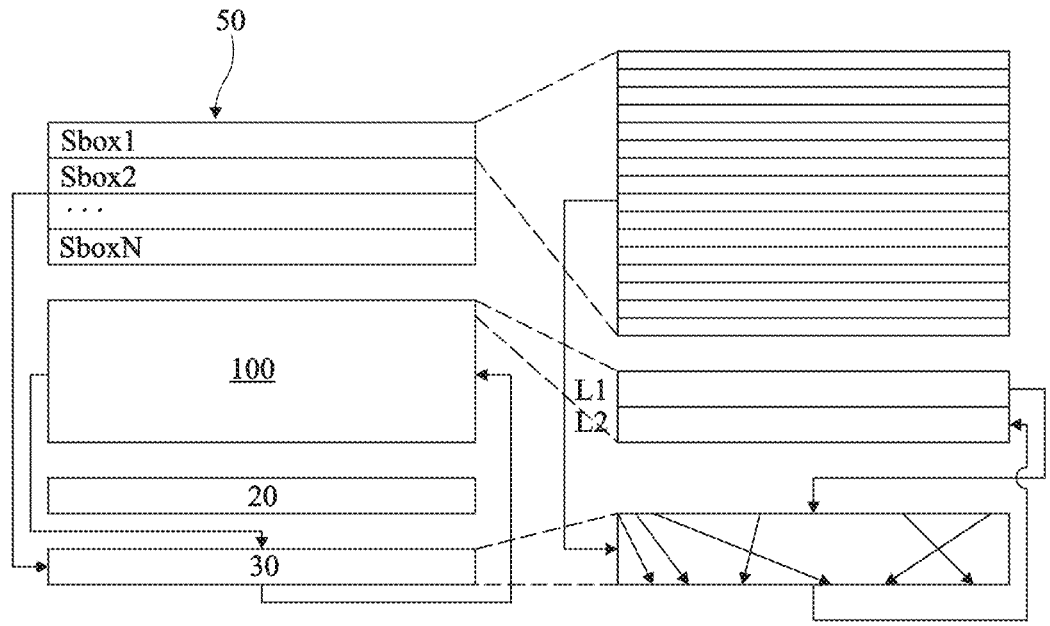
FIG. 9 schematically shows an example of a data processing method capable of being implemented by a memory circuit according to an embodiment.

FIG. 9 is a block diagram schematically showing an example of implementation of step SubBytes of the AES standard in a memory circuit of the above-described type.

The AES standard further comprises a step called Shift-Rows, during which the second, third, and fourth rows of an array of 4×4 bytes are circularly shifted by 1 byte, by two bytes, and by three bytes. To perform this operation, the data of the input array are for example arranged in the form of a 16-byte row vector corresponding to a concatenation of four rows of the array. This vector is applied to the input of shuffle circuit 30. Shuffle circuit 30 is configured to deliver a 16-byte output vector corresponding to a concatenation of the first row of the input array, of the second row of the input array circularly shifted by 1 byte, of the third row of the input array circularly shifted by 2 bytes, and of the fourth row of the input array circularly shifted by three bytes. The corresponding configuration of shuffle circuit 30 may be stored in the memory circuit, in the main memory in the example of FIG. 3 or in the additional memory in the example of FIG. 7.

Figure 10:
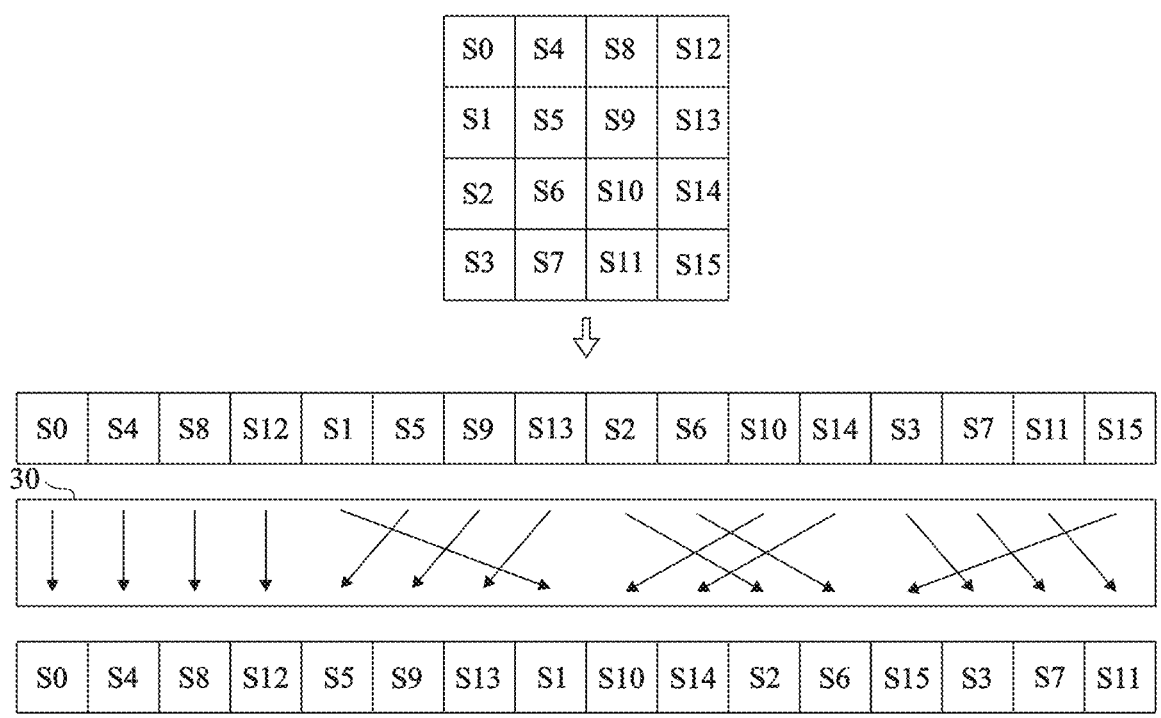
FIG. 10 schematically shows another example of a data processing method capable of being implemented by a memory circuit according to an embodiment.

FIG. 10 schematically illustrates an embodiment of step ShiftRows of the AES standard in a memory circuit of the above-described type.

The AES standard further comprises a key expansion function. Such a function enables to generate, from an initial 128-bit key, an expanded key formed of 10 round keys of 128 bits each.

FIG. 10bis schematically illustrates the algorithm. View (a) of FIG. 10bis shows a general view of the algorithm. The calculation is performed on 32-bit key words, references $K_0$, $K_1$, $K_2$, $K_3$, designating the four words of the initial key and references $W_0$, $W_1$, ..., $W_{4R-1}$ designating the words of the expanded key, with $W_x=K_x$, x being an integer from 0 to 4, and R designating the number of repetitions of the expanded key. As illustrated in view (a) of FIG. 10bis, the algorithm comprises rotation operations (Rotate), successive shuffle operations (SBOX) and XOR-type operations, and an operation of cycle constant calculation (Rcon) from a one-byte start constant CST. View (b) of FIG. 10bis shows, in the form of a table of two columns, a list of operations capable of being implemented in order to implement each step of the algorithm. The left-hand column shows the function (FCT) to be implemented and the right-hand column shows the provided implementation (IMPL) of the function. In the case where function FCT is a rotation (Rotate), the provided implementation IMPL is a single shuffle operation (Shuffle× 1), that is, according to a single shuffle configuration. In the case where function FCT is a series of shuffle operations (SBOX), the provided implementation IMPL is a succession of 16 shuffle operations (Shuffle x 16). In the case where function FCT is a cycle constant calculation operation, the provided implementation IMPL comprises shift, compare, subtraction, and XOR operations. As illustrated in view (c) of FIG. 10bis, it is here provided to interlace operations (Op) performed by the memory circuit (128-bit SRAM), shown in half-tone shading in the right-hand portion of view (c) of FIG. 10bis, and operations performed by a processor (8-bit CPU) external to the memory circuit, shown in half-tone shading and hatched in the left-hand portion of view (c) of FIG. 10bis. XOR and shuffle operations performed on the keys and applied to 32-bit words are implemented by the memory circuit, so that the keys are not transmitted outside of the memory circuit (and particularly over a system bus between the processor and the memory circuit). On the other hand, the cycle constant calculation function (Rcon) is performed by the external processor since its input is a constant CST independent from the keys. The operations implemented by the processor and the operations implemented by the memory are executed in parallel. When the processor ends the calculation of function Rcon, it stores the results into the memory circuit so that they can be used back for the calculations implemented within the memory circuit.

As illustrated in view (c) of FIG. 10bis, each operation implemented by the memory circuit (right-hand portion of view (c) of FIG. 10bis) has a constant or substantially constant duration corresponding to a cycle time of the memory circuit. This greatly eases the development of compilation software capable of generating programs executable in a system comprising a memory circuit of the type described in relation with FIGS. 3 to 8bis and a processor external to the memory circuit, capable of communicating with the memory circuit.

The measurements performed by the applicant have shown that by using a memory circuit of the above-described type, a gain by a factor 12.4 in terms of execution time and a gain by a factor 5.6 in terms of electric power consumption may be obtained with respect to a conventional implementation, by means of a microprocessor, for example, a processor of Cortex M0+ type.

As a variation, a memory circuit of the type described in relation with FIGS. 3 to 8bis may be used to implement a JPEG-type image compression method.

The JPEG compression algorithm particularly comprises a step of color transformation from the RGB (red/green/blue) domain to the YUV (luminance/chrominance) domain. For this purpose, for each pixel of the image, a vector of three values, respectively corresponding to the R, G, and B components of the pixel, is multiplied by an array of 3×3 predetermined coefficients. The result of this multiplication is a vector of three values, respectively corresponding to the Y, U, and V components of the transformed image.

Figure 11:
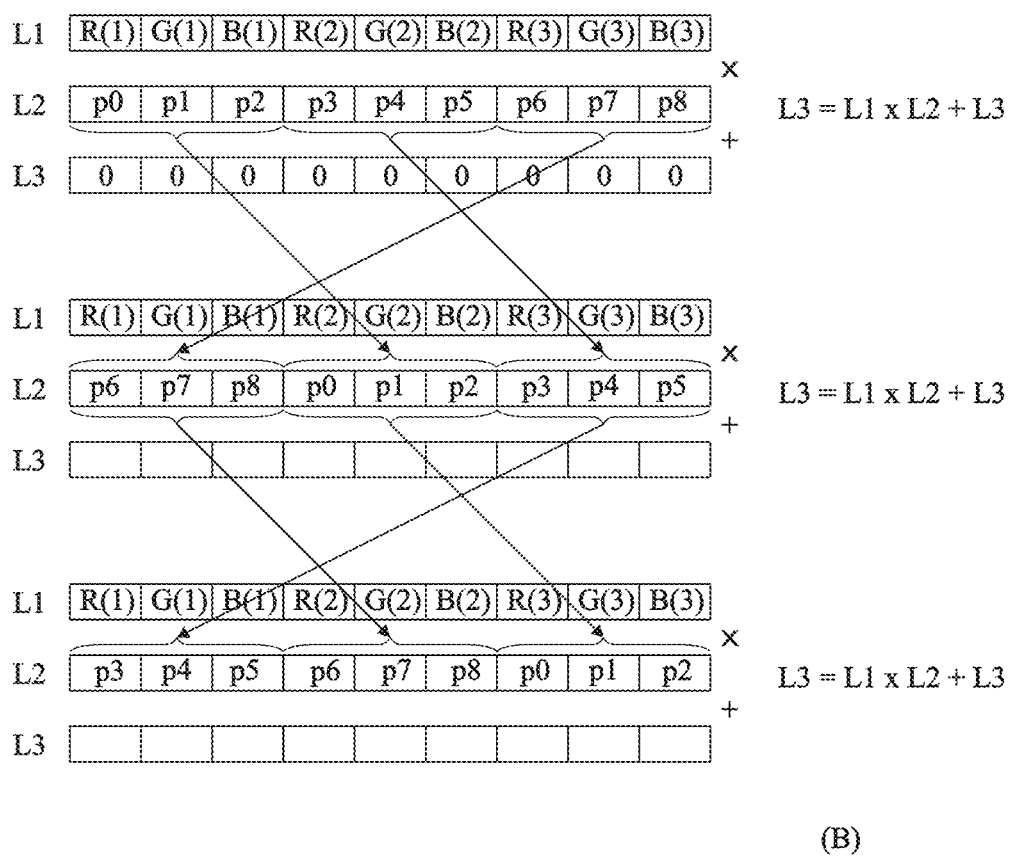
FIG. 11 schematically illustrates another example of a data processing method capable of being implemented by a memory circuit according to an embodiment.

FIG. 11, part (A), schematically illustrates this operation. FIG. 11, part (B), illustrates an example of implementation of this operation by means of a memory circuit of the type described in relation with FIGS. 3 to 8bis.

In the illustration of FIG. 11(A), the three values R, G, B of the pixel define an input column vector, values Y, U, V of the pixel define an output column vector, and the transformation array is an array of three rows and three columns, the coefficients of the first row of the array being respectively called p0, p1, and p2, the coefficients of the second row of the array being respectively called p3, p4, and p5, and the coefficients of the third row of the array being respectively called p6, p7, and p8.

In the example of implementation of FIG. 11(B), the values of the image pixels are stored in the form of a row vector L1 in a first row of the memory circuit. FIG. 11(B) shows a row vector L1 of nine values R(1), G(1), B(1), R(2), G(2), B(2), R(3), G(3), B(3), respectively corresponding to the R, G, and B values of a first pixel of the image, to the R, G, and B values of a second pixel of the image, and to the R, G, and B values of a third pixel of the image.

The coefficients of the transformation array are stored in the form of a row vector L2 in a second row of the memory circuit. FIG. 11(B) shows a row vector L2 of nine values p0, p1, p2, p3, p4, p5, p6, p7, p8 corresponding to a concatenation of the three rows of the transformation array.

FIG. 11(B) further shows a row vector L3 of nine values, initially zero, stored in a third row of the memory circuit.

In this example, the color transformation operation is entirely implemented within the memory circuit, in three cycles each comprising a multiply and add operation. At each cycle, operation L3=L1*L2+L3 is executed. In other words, at each cycle, each of the values L3(q) of vector L3 is incremented by value L1(q)*L2(q), where q is an integer ranging from 1 to 9 designating the position of the data in vectors L1, L2, and L3. Such a multiply and add operation may be implemented by the calculation circuit 20 of the memory circuit. After each multiply and add operation and before the next multiply and add operation, the values of row vector L2 are shuffled to perform a circular shift by three values (rightwards in the orientation of FIG. 11) of the transformation coefficients. This operation may be implemented by the shuffle circuit 30 of the memory circuit.

Thus, within three cycles, the color transformation of three pixels of the image can be achieved. In practice, it is possible to simultaneously process a much higher number of pixels, by increasing the dimensions of vectors L1, L2, and L3, and by repeating a plurality of times in vector L2 the series of transformation coefficients p0, p1, p2, p3, p4, p5, p6, p7, and p8. The three configurations of the shuffle circuit necessary for the implementation of this step may be stored in the memory circuit, in the main memory in the example of FIG. 3, or in the additional memory in the example of FIG. 7. More generally, the example of implementation described in relation with FIG. 11(B) may be adapted to any application comprising one or a plurality of operations of multiplication of an array by a vector.

The JPEG compression algorithm further comprises a step of sub-sampling of the image at the YUV format. This step may be implemented by means of shuffle circuit 30. More particularly, shuffle circuit 30 may be used to arrange back in order the data of a memory row containing the complete YUV representation of the image, to only keep a portion of the image, as defined by the JPEG standard. The corresponding configuration of the shuffle circuit may be stored in the memory circuit, in the main memory in the example of FIG. 3 or in the additional memory in the example of FIG. 7.

The JPEG compression algorithm further comprises a step of calculating a discrete cosine transform (DCT) of the sub-sampled YUV image. This step may be entirely implemented within the memory circuit, by using calculation circuit 20 and shuffle circuit 30.

The JPEG compression algorithm further comprises a step of entropic coding of blocks of 8*8 values generated at the end of the DCT calculation step. During this step, advantage may advantageously be taken of shuffle circuit 30 to arrange back in order the blocks of 8*8 values resulting from the DCT calculation step.

Thus, all or most of the steps of a JPEG compression algorithm may be directly implemented within a memory circuit of the type described in relation with FIGS. 3 to 8bis, without needing to have data transit outside of the memory circuit.

As a variation, a memory circuit of the type described in relation with FIGS. 3 to 8bis may be used to implement an artificial neural network inference algorithm. Many artificial intelligence applications use artificial neural networks to make decisions based on input data. Such applications are divided in two phases, a phase called training phase, and a phase called inference phase. During the training phase, the application learns to make a decision. For example, a large number of steps, among which images showing a cat and images which do not show a cat, are displayed. The cat images are identified as such and the application calculate a set of values defining an artificial neural network enabling to automatically identify an image representative of a cat. During the training phase, large data bases are used, and very significant calculation capacities are necessary. The inference phase comprises using the artificial neural network calculated during the training phase to make a decision based on input data, for example, to detect the possible presence of a cat on an image. The inference phase is based on arithmetical operations and particularly array multiplications, which may be easily implemented in a memory circuit of the type described in relation with FIGS. 3 to 8bis.

An operation of array multiplication R=A*B is performed, where A and B are arrays of 4 rows and 4 columns defined as follows:

$$A = \begin{bmatrix} a00 & a01 & a02 & a03 \\ a10 & a11 & a12 & a13 \\ a20 & a21 & a22 & a23 \\ a30 & a31 & a32 & a33 \end{bmatrix} \text{ and} \quad \text{[Math 1]}$$

$$B = \begin{bmatrix} b00 & b01 & b02 & b03 \\ b10 & b11 & b12 & b13 \\ b20 & b21 & b22 & b23 \\ b30 & b31 & b32 & b33 \end{bmatrix} \quad \text{[Math 2]}$$

To implement operation R=A*B by means of a memory circuit of the type described in relation with FIGS. 3 to 8bis, each of the arrays may be stored in a row of the memory, in the form of a row vector corresponding to the concatenation of the values of the four rows of the array.

The transpose BT of array B, defined as follows:

$$BT = \begin{bmatrix} b00 & b10 & b20 & b30 \\ b01 & b11 & b21 & b23 \\ b02 & b12 & b22 & b32 \\ b03 & b13 & b23 & b33 \end{bmatrix} \quad \text{[Math 3]}$$

can then be calculated by using the shuffle circuit 30 of the memory circuit.

The row vectors containing array A and array BT may be multiplied point by point by using the calculation circuit 20 of the memory circuit.

The accumulation of the results of sub-products (**a00*b00, a01*b10, a02*b20, a03*b30, a10*b01, a11*b11, a12*b21, a13*b31, a20*b02, a21*b12, a22*b22, a23*b32, a30*b03, a31*b13, a32*b23, a33*b33**) to calculate 4*4 coefficients of array R may be iteratively performed by the calculation circuit 20 of the memory circuit.

Thus, all or part of the steps of an artificial neural network inference algorithm may be directly implemented within a memory circuit of the type described in relation with FIGS. 3 to 8bis, without needing to have data transit outside of the memory circuit.

As an example, by using a memory circuit of the above-described type, two array multiplications may be performed within 6 memory cycles. The number of operations is 32 per cycle and per array (16 additions and 16 multiplications), that is, 64 operations per cycle. In terms of data movements, a memory instruction should be provided for the rotation of the array and four memory instructions should be provided for the implementation of the two array multiplications, that is, 5 memory accesses, to be compared with 64 read accesses for a standard implementation via a microprocessor.

More generally, the above-described example of implementation of an array multiplication operation may be adapted to any application comprising one or a plurality of array multiplication operations.

Various embodiments and variations have been described. It will be understood by those skilled in the art that certain features of these various embodiments and variations may be combined, and other variations will occur to those skilled in the art. In particular, the described embodiments are not limited to the examples of application of the memory circuit mentioned in the present description. Further, the described embodiments are not limited to the examples of implementation of the shuffle circuit described in relation with FIGS. 4 to 6. Further, the described embodiments are not limited to the specific example of elementary storage cells 10 described in relation with FIG. 2.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A memory circuit comprising:
a plurality of elementary storage cells arranged in an array of rows and of columns, the cells of a same column sharing a same read bit line and a same write bit line;
an internal control circuit implementing a calculation operation comprising the simultaneous activation in read mode of at least two rows of the array; and
a shuffle circuit comprising a data input register, a configuration register, and an output port, the shuffle circuit delivering on its output port the data stored in its input register shuffled according to a shuffle operation defined according to a state of its configuration register,
wherein the shuffle circuit is a configurable routing circuit with a parallel architecture, such that the time of implementation of a shuffle operation is substantially constant whatever the respective contents of the input register and of the configuration register of the shuffle circuit are.

2. The memory circuit of claim 1, wherein the control circuit implements a shuffle operation comprising a step of reading configuration data stored inside of the memory circuit and of copying the data into the configuration register of the shuffle circuit.

3. The memory circuit of claim 2, wherein the shuffle operation comprises:
activating in read mode at least a first row of the array;
copying data read from the read bit lines of the array into the data input register of the shuffle circuit;
copying data supplied on the output port of the shuffle circuit onto the write bit lines of the array; and
activating in write mode at least one row of the array.

4. The memory circuit of claim 2, wherein the shuffle operation comprises:
activating in read mode at least a second row of the array; and
copying data read from the read bit lines of the array into the configuration register of the shuffle circuit.

5. The memory circuit of claim 2, comprising, in addition to the array of elementary storage cells, an additional memory intended to store data of configuration of the shuffle circuit.

6. The memory circuit of claim 5, wherein the shuffle operation further comprises copying the data read from the additional memory into the configuration register of the shuffle circuit.

7. The memory circuit of claim 5, wherein the additional memory is a non-volatile memory.

8. The memory circuit of claim 1, wherein the shuffle circuit comprises a plurality of elementary shuffle cells, each comprising two data inputs e1 and e2, two data outputs s1 and s2, and one configuration input c.

9. The memory circuit of claim 8, wherein the shuffle circuit comprises $(K/2)*(2*\log_2(K)-1)$ elementary shuffle cells arranged in a Benes network, where K is an integer designating the dimension of the input register and of the output port of the shuffle circuit.

10. The memory circuit of claim 8, wherein the shuffle circuit comprises 16 elementary shuffle cells arranged in 5 rows, the rows of rank l=1 to l=3 each comprising 4 elementary cells and the rows of rank l=4 to l=5 each comprising 2 elementary cells, the input register and the output port of the shuffle circuit being of dimension 8, and l being an integer in the range from 1 to 5.

11. The memory circuit of claim 1, further comprising an input-output circuit configurable to couple the read bit lines of the array to the input register of the shuffle circuit and/or to couple the write bit lines of the array to the output port of the shuffle circuit.

12. The memory circuit of claim 11, further comprising a calculation circuit capable of implementing logic or arithmetic operations having data stored in the array of elementary storage cells of the memory circuit as operands.

13. The memory circuit of claim 12, wherein the input-output circuit is further configurable to couple the read bit lines of the array to an input register of the calculation circuit and/or to couple the write bit lines of the array to an output port of the calculation circuit.

* * * * *